United States Patent [19]
Takahashi et al.

[11] Patent Number: 5,815,098
[45] Date of Patent: Sep. 29, 1998

[54] CIRCUIT AND METHOD FOR EFFICIENTLY EXPANDING COMPRESSED DATA STORED IN MEMORY

[75] Inventors: Toyofumi Takahashi; Toshio Tanaka; Hideaki Terakawa, all of Hyogo, Japan

[73] Assignees: Creative Design, Inc., Hyogo; Nintendo Co., Ltd., Kyoto, both of Japan

[21] Appl. No.: 647,962

[22] PCT Filed: Sep. 27, 1995

[86] PCT No.: PCT/JP95/01959

§ 371 Date: Jun. 20, 1996

§ 102(e) Date: Jun. 20, 1996

[87] PCT Pub. No.: WO96/10788

PCT Pub. Date: Apr. 11, 1996

[30] Foreign Application Priority Data

Sep. 30, 1994 [JP] Japan ..................... 6-236971

[51] Int. Cl.[6] .................................................. H03M 7/40
[52] U.S. Cl. .................................................. 341/67; 341/60
[58] Field of Search .................................. 341/60, 65, 67

[56] References Cited

U.S. PATENT DOCUMENTS

| | | | |
|---|---|---|---|
| 5,140,322 | 8/1992 | Sakagami | 341/65 |
| 5,162,795 | 11/1992 | Shirota | 341/67 |
| 5,173,695 | 12/1992 | Sun et al. | . |
| 5,245,338 | 9/1993 | Sun | 341/67 |
| 5,343,195 | 8/1994 | Cooper | . |
| 5,557,271 | 9/1996 | Rim et al. | 341/67 |

FOREIGN PATENT DOCUMENTS 61-75386  4/1986  Japan .

*Primary Examiner*—Howard L. Williams
*Attorney, Agent, or Firm*—Nixon & Vanderhye P.C.

[57] ABSTRACT

A variable bit-length code processing circuit includes first, second and third registers (12, 20, 22) each of which is of 1 word, and memory data is loaded to the first register (12), and a variable bit-length code is withdrawn from the third register (22). The second register (20) and third register (22) are coupled to a barrel shifter (16) which barrel-shifts data of 2 words according to a barrel shift amount which is applied by a subtracter (30) on the basis of the number of the valid bits and the number of the remaining bits.

18 Claims, 18 Drawing Sheets

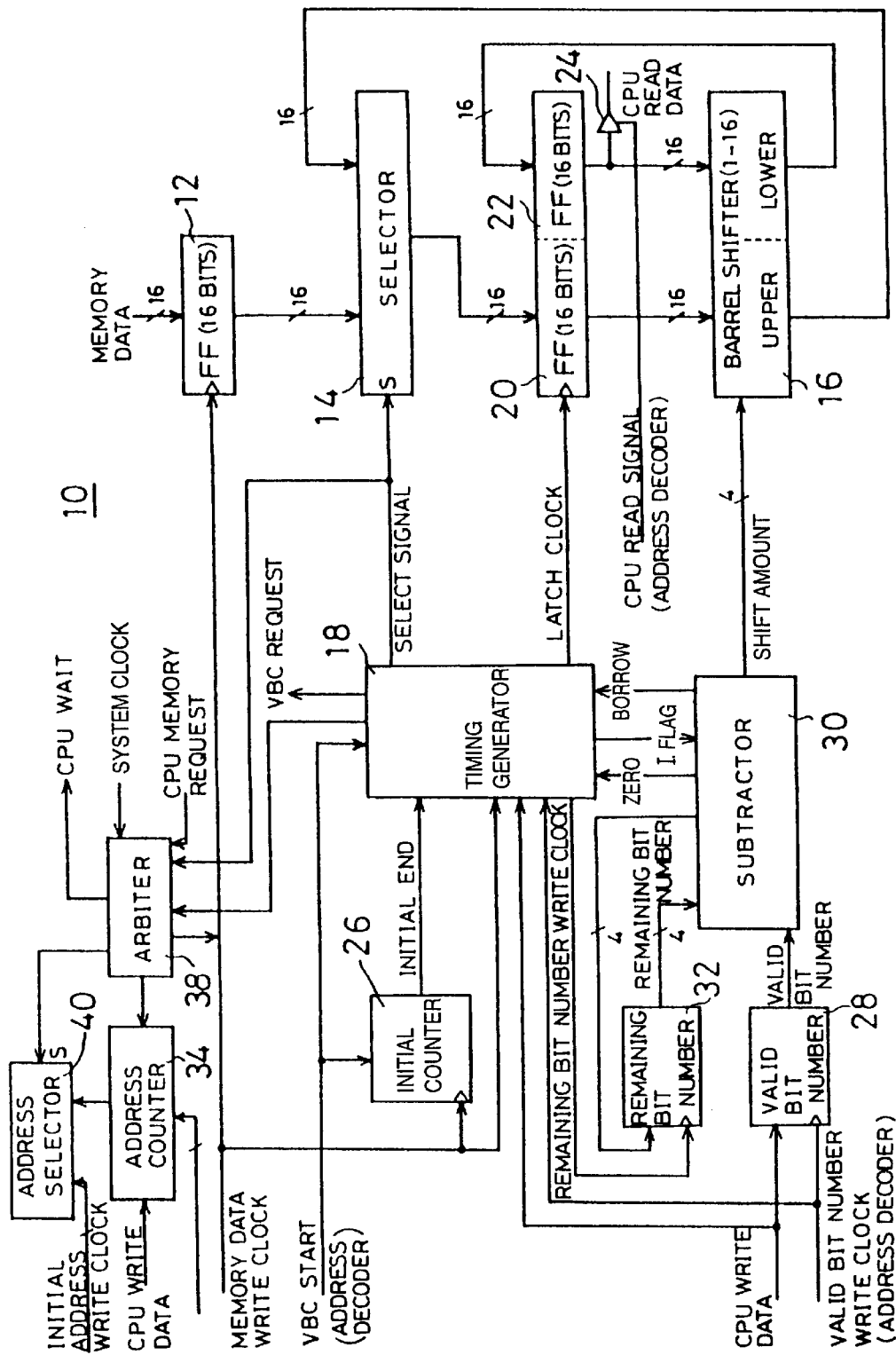
F I G. 1

F I G. 7 g2 g1 g0 f10 f9 f8 f7 f6 f5 f4 f3 f2 f1 f0 e0 d6

(5 BITS SHIFT) 0 0 0 0 d5 d4 d3 d2 d1 d0 c13 c12 c11 c10 c9 c8 c7 c6 c5 c4 c3 c2 c1 c0 b6 b5 b4 b3 b2 b1 b0

VALID BITS : 7 BITS

CIRCUIT AND METHOD FOR EFFICIENTLY EXPANDING COMPRESSED DATA STORED IN MEMORY

FIELD OF ART

The present invention relates to a circuit and method for processing variable bit-length codes, and especially to a circuit and method for processing variable bit-length codes which are efficiently, with no blanks, stored in a memory such as compressed data of an image and a sound.

PRIOR ART

One example of such a kind of a variable bit-length code processing circuit is disclosed in, for example, in Japanese Patent Application Laying-open No. 4-245778 laid-open on Sep. 2, 1992. This prior art includes a 1-word shift register (11) which holds input code data, and a 3-word shift register (12) which holds data transferred from the shift register (11) in a bit-parallel fashion, and the data within the shift register (11) is cut-out and transferred by a shift/transfer control portion (30) by the number of the bits capable of filling data blank portions in the shift register (12).

In the above described prior art, since proceeding data which becomes unnecessary is discharged by serially shifting the shift register (12), it is necessary to be provided with shift registers of 4 words in total, and a shift/transfer control which controls shift operations of the shift registers. Although a detail of the shift/transfer control is not disclosed, it is necessary for the shift/transfer control to be provided with a counter for counting the number of the shift times, a control circuit for a shift clock, a transfer control circuit which transfers the data from the shift register (11) to the shift register (12) in a bit-parallel fashion by an arbitrary number of bits, a sequencer and etc., and therefore, a circuit scale becomes large. Furthermore, in order to connect the preceding data to succeeding data in a bit-stream, bits corresponding to blank bits pushed-out by the shift register (11) are shifted by the shift register (12) and written in the shift register (11) bit by bit, and therefore, in the prior art, there was a problem that the number of the processing steps becomes large, and therefore, it takes a long time to withdraw the data.

SUMMARY OF THE INVENTION

Therefore, a principal object of the present invention is to provide a data processing circuit and method capable of rapidly withdrawing a variable bit-length code with a simple circuit.

A variable bit-length code processing circuit in accordance with one aspect of the present invention includes a first 1-word register which holds data applied in a bit-parallel fashion; a second 1-word register which receives the data from the first register in a bit-parallel fashion; a third 1-word register from which a variable bit-length code is withdrawn; a comparison means which compares the number of the valid bits with the number of the remaining bits of the data held in the second register and outputs a first signal at a time that the number of the valid bits is larger than the number of the remaining bits; a first barrel shift means which loads data barrel-shifted from the second register and the third register by the number of the remaining bits to the third register in response to the first signal outputted from the comparison means; a load means which loads the data in the first register to the second register in a bit-parallel fashion in response to the first signal outputted from the comparison means; and a second barrel shift means which loads the data barrel-shifted from the second shift register and the third shift register by the number of the bits equal to a difference between the number of the valid bits and the number of the remaining bits to the second register and the third register after the data in the first register is loaded to the second register by the load means.

Furthermore, in accordance with another aspect of the present invention, a processing method in a variable bit-length code processing circuit which comprises a first 1-word register which holds data applied in a bit-parallel fashion, a second 1-word register which receives the data from the first register in a bit-parallel fashion, and a third 1-word register from which a variable bit-length code is withdrawn, comprises the steps of at a time that the number of the valid bits is larger than the number of the remaining bits of the data held in the second register, (a) loading the data barrel-shifted from the second register and the third register by the number of the remaining bits to the third register; (b) loading the data of the first register to the second register in a bit-parallel fashion; and (c) loading the data of the second register and the third register by barrel-shifting by the number of the bits equal to a difference between the number of the valid bits and the number of the remaining bits.

The data of 1-word, for example, read from a memory is loaded to the first register in a bit-parallel fashion. The data of the first register is loaded to the second register in a bit-parallel fashion, and the data of the second register is loaded to the third register with being barrel-shifted by the first barrel shift means by 16 bits, for example. The variable bit-length code is withdrawn from the third register. In the comparison means including a subtracter, for example, the number of the valid bits being set by CPU, for example, is subtracted from the number of the remaining bits of the data held in the second register. Then, if a subtraction result becomes negative, a borrow signal (the first signal) is outputted from the subtracter. At a time that the borrow signal is outputted, a barrel shifter is operated, and the data in the second register and the third register is loaded to the third register with being barrel-shifted by the number of the remaining bits. At this time, the data being forced out by barrel-shifting by means of the first barrel shift means is lost and not used. Furthermore, the data of the first register is loaded to the second register, and then, the data of the second register is barrel-shifted by the second barrel shift means by "the number of the valid bits—the number of the remaining bits" together with the data in the third register, and loaded to the second register and the third register. "0" is written in blank portions of second register which are formed by barrel-shifting by the second barrel shift means.

In accordance with one aspect of the present invention, a processing circuit may be provided with latches of 3 words in total, and a plurality of selectors for constituting the barrel shift means and a subtracter, and therefore, in comparison with the prior art, the circuit structure becomes simple, and the valid data can be set with barrel shift operations of two steps at most, and accordingly, a processing time shortened, and therefore, the data processing further becomes rapid.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing one embodiment according to the present invention;

FIG. 7 is an illustrative view showing states of the respective registers in explaining the operation of FIG. 1 embodiment;

THE BEST MODE FOR EMBODYING THE INVENTION

Figure 2:
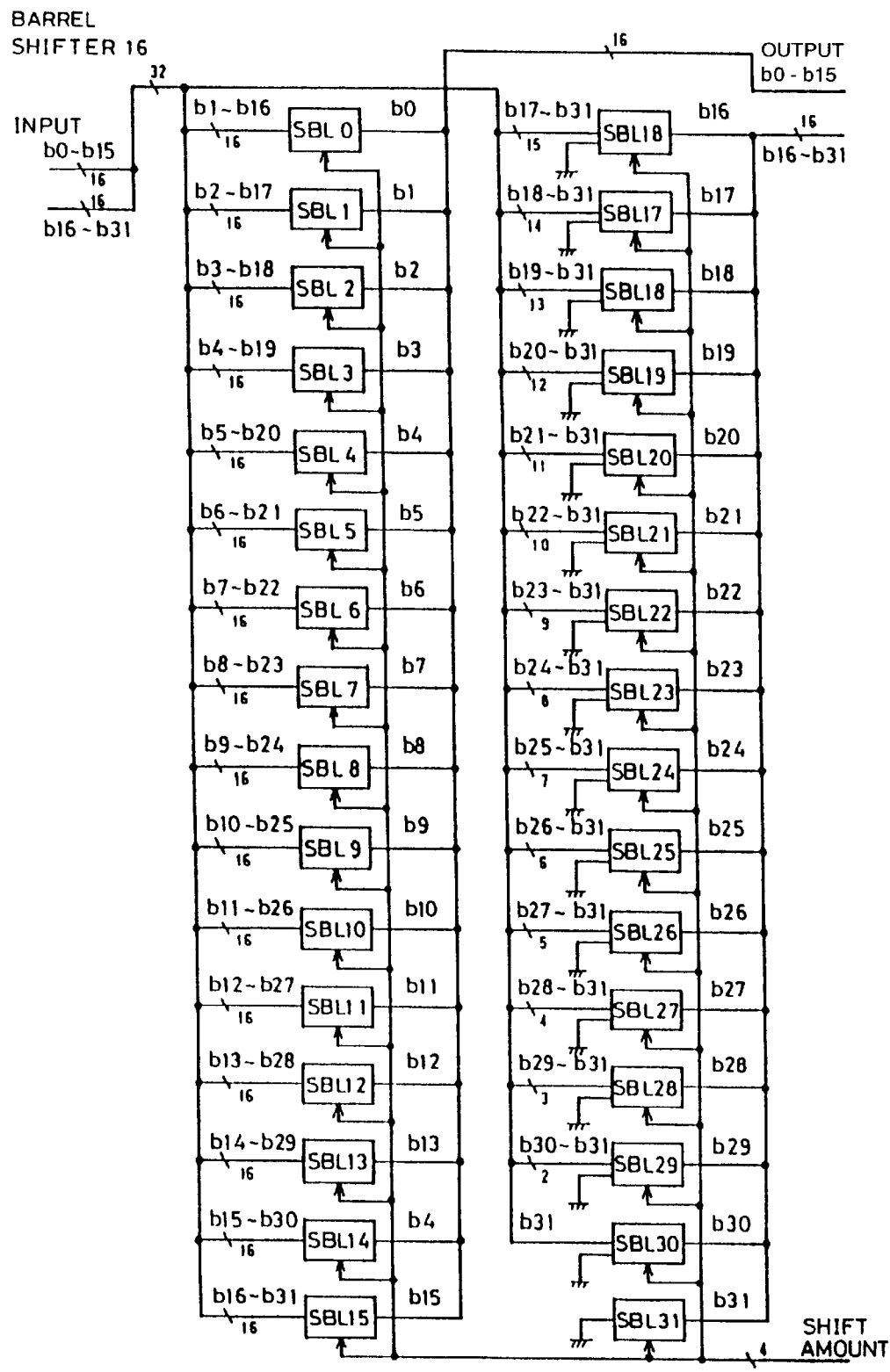
FIG. 2 is a block diagram showing in detail a barrel shifter of FIG. 1 embodiment.

A variable bit-length code processing circuit 10 shown in FIG. 1 is a circuit for processing variable bit-length codes or variable bit-length data outputted from a memory (not shown), and includes a first register 12 which is of 1 word (16 bits) and receives the memory data of 1 word from the memory in a bit-parallel fashion. The data of the first register 12 is applied to a selector 14 in a bit-parallel fashion. The selector 14 is a circuit for selecting and outputting one of two inputs (16 bits, respectively), and receives 16 bits from the above described first register 12 as one input and upper 16 bits of a barrel shifter 16 as the other input. The selector 14 selectively loads the data from the first register 12 or the data from the barrel shifter 16 to a second register 20 in a bit-parallel fashion in response to a select signal of "0" or "1" from a timing generator 18. Therefore, the selector 14 constitutes a portion of first to fourth barrel shift means, and functions as a load means for loading the data of the first register 12 to the second register 20. The second register 20 is a register of 1 word (16 bits), and the data of the second register 20 is applied to the barrel shifter 16 in a bit-parallel fashion. A third register 22 is also a register of 1 word (16 bits). In addition, it was described for convenience that the second register 20 and the third register 22 are discrete registers; however, in fact, the second register 20 and the third register 22 are constructed as a single register or latch of 2 words (32 bits).

The data of the second register 20 is applied to the upper 16 bits of the barrel shifter 16, and the data of the third register 22 is applied to lower 16 bits of the barrel shifter 16. The barrel shifter 16 barrel-shifts respective 16-bit parallel data of the second register 20 and the third register 22 in a rightward direction as single 32-bit data. The upper 16 bits of the data being barrel-shifted are applied to the selector 14 as described above, but lower 16 bits of the data being barrel-shifted are applied to the second register 22 in a bit-parallel fashion. Therefore, it will be clearly understood that the barrel shifter 16 constitutes a portion of the first to fourth barrel shift means. Then, the data of the third register 22 is withdrawn from a tri-state gate 24 as valid data by the CPU (not shown).

Now, the barrel shift will be described. In data shifting utilizing a normal shift register, the data is shifted in a rightward direction or a leftward direction bit by bit in response to a clock applied one time. In a case where the data is to be shifted by 5 bits, for example, the data is shifted by 5 bits in a rightward direction or a leftward direction in response to five clocks. In contrast, in a case where the barrel shift now described is utilized, the data is shifted in a rightward direction or a leftward direction by a plurality of bits at one time. The number of the bits to be shifted with one clock is determined by a shift amount applied from a subtracter 30 (described later).

In order to perform such barrel shifting, the barrel shifter 16 of this embodiment shown can be constructed with thirty two (32) selectors SBL0–SBL31 as shown in FIG. 2. The barrel shifter 16 is applied with data of 32 bits in total of 16-bit parallel data b16–b31 from the third register 22 and 16-bit parallel data b0–b15 from the second register 20. Respective bits of the 32-bit data are regarded as b0–b31 in an order from a least significant bit to a most significant bit, respectively.

On the other hand, as described previously, the barrel shifter 16 can perform the barrel shifts of 16 bits at most. The barrel shift is implemented by the selectors SBL0–SBL31. In the following, operations of respective selectors SBL0–SBL31 will be described.

The selector SBL0 which determines an output of a least significant bit of the barrel shifter 16 is a 16-1 selector (a selector selects and outputs an arbitrary 1 bit out of 16 bits) which selects and outputs 1 bit out of the bits b1–b16, and the bit to be selected is determined in accordance with the shift amount applied by the subtracter 30 (FIG. 1). As similar to the selector SBL0, each of the selectors SBL1, SBL2, SBL3, . . . SBL15 is the 16-1 selector which selects and outputs 1 bit out of the bits b2–b17, b3–b18, b4–b19, . . . b16–b31 in accordance with the shift amount applied by the subtracter 32.

On the other hand, each of the selectors SBL16–SBL31 can not be constructed by the 16-1 selector which is utilized for the selectors SBL0–SBL15 because the selector SBL16 can not select and output 1 bit from the bits b17–b32. A reason is that only the data of 32 bits b0–31 is applied to the barrel shifter 16, and therefore, it is impossible to select the bit b32 not being applied to the barrel shifter 16. Then, in a case where the selector SBL16 is instructed to perform the barrel shift of 16 bits according to the shift amount from the subtracter 30, the selector SBL16 outputs "0" instead of the bit b32. That is, the selector SBL16 is a 16-1 selector which selects and outputs 1 bit out of the bits b17–b31 and "0". Furthermore, since the bits b32 and b33 are not applied to the barrel shifter 16, the selector SBL17 can not select and output 1 bit out of the bits b18–b33. Therefore, in a case where the selector SBL17 is instructed to perform the barrel shift of 15 bits or more by the subtracter 30, that is, in a case where the SBL17 is instructed to select the bit b32 or b33, the selector SBL17 outputs "0". In other words, the selector SBL17 is a 15-1 selector which selects and outputs 1 bit out of the bits b18–b31 and "0". Likewise, the selectors SBL18, SBL19, SBL20, . . . SBL30 are 14-1 selector which selects and outputs 1 bit out of the bits b19–b31 and "0", a 13-1 selector which selects and outputs 1 bit out of the bits b20–b31 and "0", a 12-1 selector which selects and outputs 1 bit out of the bits b21–b31 and "0", . . . a 2-1 selector which selects and outputs 1 bit out of the bit b31 and "0". Then, the selector SBL31 is a 1—1 selector which outputs only "0" irrespective of a value of the shift amount, and therefore, an output of the selector SBL31 is fixed at "0".

Thus, the barrel shifter 16 selects bits out of 32 bits b0–b31 and "0" applied from the second register 20 and the third register 22 in accordance with the shift amount designated by the subtracter 30 (FIG. 1), and resultingly, the barrel shifter 16 barrel-shifts the data by a required number of bits, and as a result of the barrel shift, bits being forced out are lost, and "0" is written in bits which become blanks.

Figure 3:
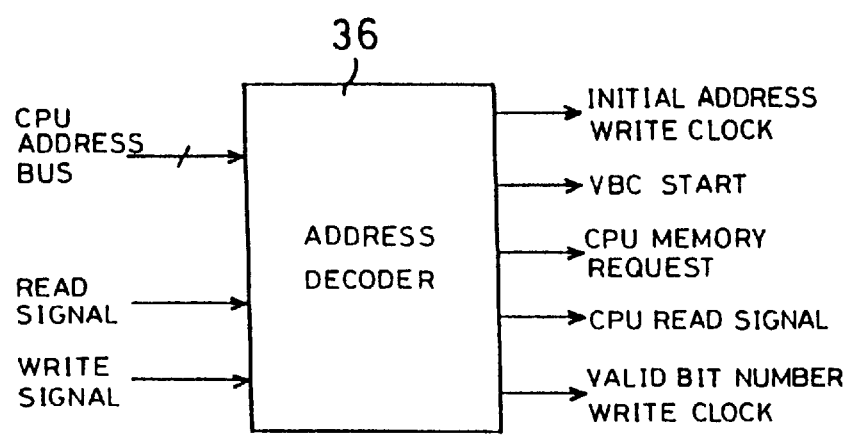
FIG. 3 is a block diagram showing an address decoder of FIG. 1 embodiment.

In addition, the memory data from the memory (not shown) is loaded to the first register in response to a memory data write clock (described later), and the data from the selector 14 is loaded to the second register 20 in response to a latch clock outputted from the timing generator 18. Then, the tri-state gate 24 is controlled by a CPU read signal outputted from an address decoder (FIG. 3). That is, at a time that the CPU read signal is "1", CPU read data is withdrawn from the tri-state gate 24. The above described address decoder outputs a VBC start signal which indicates a start of the processing of the variable bit-length data or variable bit-length code (VBC), and the VBC start signal is applied to the above described timing generator 18 and an initial counter 26 which also receives the memory data write clock so as to be incremented in response to the VBC start signal. The timing generator 18 is enabled in response to the VBC start signal so as to generate a VBC request signal. The VBC request signal is generated in synchronization with the memory data write clock.

CPU write data from the CPU (not shown) is applied to not only a valid bit number register 28 also the timing generator 18. Valid bit number data is applied by 4 bits, for example, and utilized for determining the barrel shift amount. "0000" of the valid bit number data indicates the valid bit number of "16", "0001" of the valid number data indicates the valid bit number of "1", "0010" of the valid bit number data indicates the valid bit number of "2", and so on, and therefore, "1111" of the valid bit number data indicates the valid bit number of "15". Furthermore, a valid bit number write clock from the address decoder is applied to the valid bit number register 28 and the timing generator 18.

The data of the number of the valid bits loaded to the valid bit number register 28 is applied to one input of the subtracter 30. Data of the number of the remaining bits outputted from a remaining bit number register 32 is applied to the other input of the subtracter 30. That is, the subtracter 30 performs a subtraction operation of "the number of the remaining bits—the number of the valid bits", and therefore, the subtracter 30 can determine the number of the remaining bits in the second register 20. Therefore, the remaining bit number data is outputted from the subtracter 30, and a remaining bit number write clock is applied from the timing generator 18 to the remaining bit number register 32, and therefore, the remaining bit number data is held in the remaining bit number register 32. Thus, the subtracter 30 performs a calculation operation of "the remaining bit number—the valid bit number", and outputs a subtraction result as new remaining bit number data, and outputs a borrow signal (first signal) of "1" when the latter is larger than the former, and outputs a zero signal (second signal) of "1" when the former and the latter are equal to each other. Therefore, at a time that the borrow signal and the zero signal are both "0", it is possible to regard as that a third signal is outputted from the subtracter 30. The borrow signal and the zero signal are respectively applied to the timing generator 18 which outputs a select signal and a latch clock according to the borrow signal and the zero signal, respectively.

In addition, the subtracter 30 sets the number of the bits to be barrel-shifted, i.e. the shift amount to the barrel shifter 16. For example, when the first signal is outputted, the remaining bit number data is first applied as the shift amount, and then, "valid bit number—remaining bit number", i.e. an absolute value of the subtraction result is applied. If the second signal is outputted, the remaining bit number data is applied as the shift amount, and if the third signal is outputted, as the shift amount, the valid bit number data is applied.

Start address data of the variable bit-length code being stored in the memory is preset in the address counter 34 in response to an initial address write clock applied from an address decoder 36 (FIG. 3). The address data preset in the address counter 34 is incremented in response to the memory data write clock applied from an arbiter 38. Therefore, even if a single variable bit-length code is successively stored in a plurality of words within the memory, only by presetting the start address of the variable bit-length code in the address counter 34 once, it is possible to successively read the variable bit-length code within the plurality of words and latch the data in the first register 12.

An address selector 40 changes-over address data of a CPU address bus being applied from the CPU or address data applied by the address counter 34, and applies selected address data to the memory. The change-over is performed on the basis of the select signal from the arbiter 38.

The arbiter 38 is a circuit for controlling an operation of the variable bit-length code processing circuit 10 and a timing that the memory is accessed by the variable bit-length code processing circuit 10 and the CPU.

The arbiter 38 is applied with a system clock, a CPU memory request signal from the address decoder 36, and the select signal and an initial flag from the timing generator 18. The arbiter 38 determines that the select signal from the timing generator 18 is a signal for changing-over the selector 14 so as to the data latched in the first register 12 is to be supplied to the second register 20. In response to such determination, the arbiter 38 generates a count signal by which the address counter 34 is incremented, and succeedingly, generates the memory data write clock by which the variable bit-length code being applied from the memory is latched to the first register 12. In addition, in a case where the initial flag from the timing generator 18 indicates an initial state, no count signal is generated. Furthermore, the arbiter 38 generates the select signal by which the address selector 40 is instructed to supply the address signal from the address counter 34 to the memory prior to the memory data write clock is generated.

On the other hand, the arbiter 38 determines whether or not the CPU requires to access the memory by supervising the CPU memory request signal from the address decoder 36 (FIG. 3). Then, at a time that the CPU requires to access the memory and that the address selector 40 is changed-over into a state that the address data from the address counter 34 is applied to the memory, the arbiter 38 applies a wait signal to the CPU so as to bring the CPU into a wait state.

Now, with reference to FIG. 3, a CPU address bus, a read signal line and a write signal line are connected to the address decoder 36, and therefore, the address data from the CPU, the read signal from the CPU and the write signal from the CPU are applied to the address decoder 36. The CPU has a memory space of a predetermined size, and the above described memory, the start of the variable bit-length code processing, the third register 22, the valid bit number register 28 and etc. are assigned to predetermined addresses within the memory space. The address decoder 36 always supervises the address data, the read signal and the write signal which are outputted from the CPU, and at a time that the CPU accesses the address assigned to the memory and outputs the read signal or the write signal, the address decoder 36 generates the CPU request signal. Furthermore, if the CPU accesses the address for starting the variable bit-length code processing and outputs the write signal, the address decoder 36 generates the VBC start signal which makes the variable bit-length code processing circuit 10 to start the processing of the variable bit-length code. Furthermore, in a case where the CPU accesses the address assigned to the address counter and outputs the write signal, the address decoder 36 generates the initial address write clock. Furthermore, when the CPU accesses the address assigned to the third register and outputs the read signal, the address decoder 36 generates the CPU read signal. In addition, when the CPU accesses the address assigned to the valid bit number register 28 and outputs the write signal, the address decoder 36 generates the valid bit number write clock signal.

Figure 4:
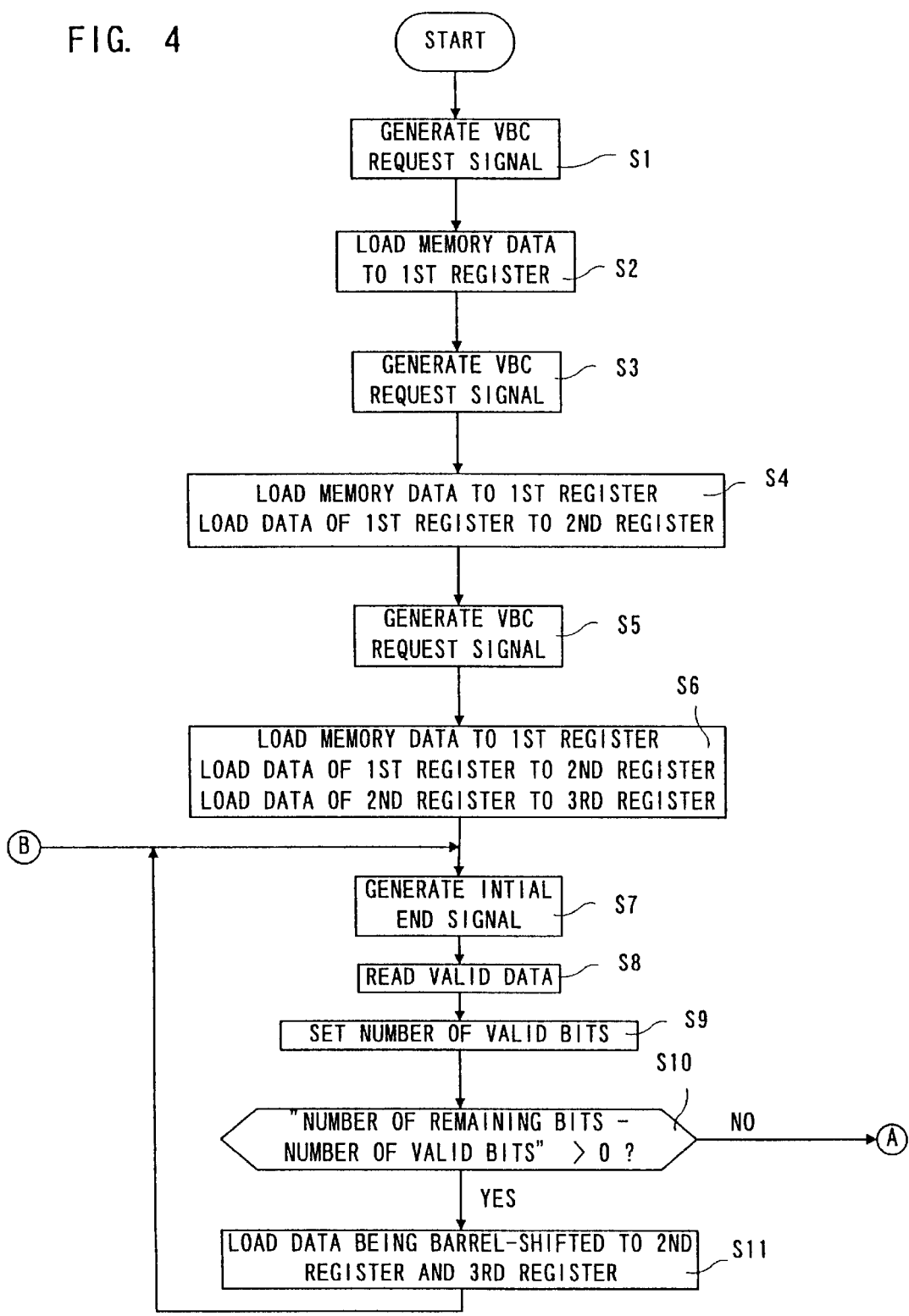
FIG. 4 is a flowchart showing an operation of FIG. 1 embodiment.
Figure 5:
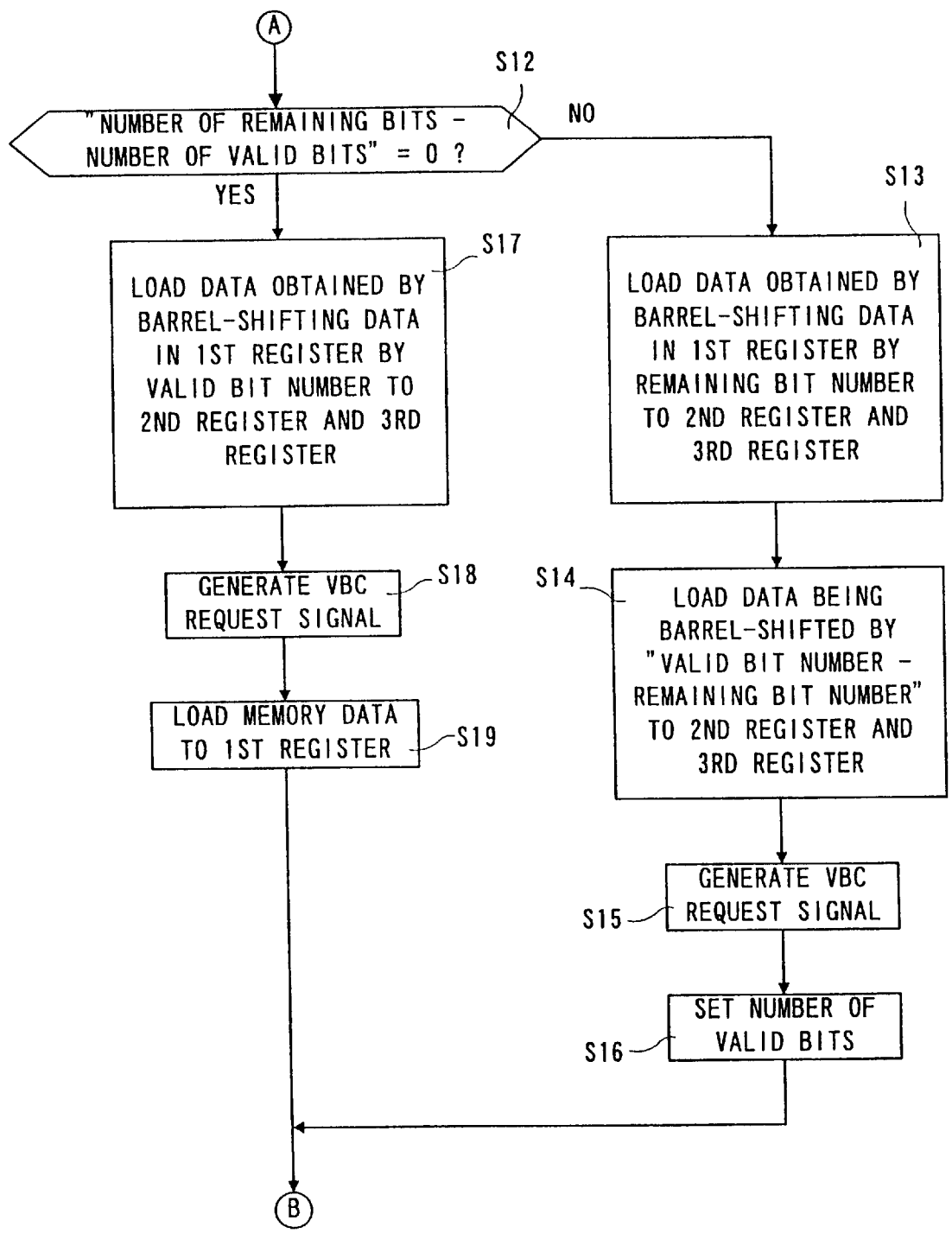
FIG. 5 is a flowchart showing an operation of FIG. 1 embodiment.

With reference to FIG. 4 and 5, an operation of FIG. 1 embodiment will be described. In addition, FIG. 1 embodiment is implemented in hardware; however, the FIG. 1 embodiment operates according to flowcharts FIG. 4 and FIG. 5. Therefore, FIG. 1 circuit may be replaced with a microcomputer which operates according to the flowcharts of FIG. 4 and FIG. 5.

An operation from a step S1 to a step S7 of FIG. 4 is an initial setting operation. More specifically, the timing generator 18 is enabled in response to the VBC start signal from the CPU and thus the address decoder 36 (FIG. 3), and in the step S1, the timing generator 18 outputs the VBC request signal. In addition, the address decoder 36 outputs the VBC start signal when the predetermined address data is outputted from the CPU as described above. At this time, the CPU sets the memory read address for the memory address counter 34 (FIG. 1). In response thereto, in the step S2, the memory data is read from the memory (not shown), and the memory data is loaded to the first register 12 in a bit-parallel fashion in response to the memory data write clock. In response to the memory data write clock, the address counter 34 is incremented. In addition, in the memory (not shown), the variable bit-length code, that is, the data having the variable number of the valid bits is efficiently (with no blank) stored in an address sequence. The timing generator 18 counts the memory data write clock, and in the next step S3, the timing generator 18 generates again the VBC request signal. Therefore, in the next step S4, the memory data from the address being incremented in the memory (not shown) is loaded to the first register 12 in a bit-parallel fashion, and because the select signal from the timing generator 18 is "1", the data in the first register 12 is loaded to the second register 20 in a bit-parallel fashion via the selector 14. The timing generator 18 counts the further memory data write clock, and in the next step S5, generates the VBC request signal again. Therefore, in the next step S6, the memory data from the memory (not shown) is loaded to the first register 12 in a bit-parallel fashion, and since the select signal from the timing generator 18 is "1", the data of the first register 12 is loaded to the second register 20 via the select 14 in a bit-parallel fashion. The initial flag from the timing generator 18 is applied to the subtracter 30, and therefore, "16", i.e. "0000" is applied to the barrel shifter 16 from the subtracter 30. The data of the second register 20 is loaded to the third register 22 via the barrel shifter 16. Since the initial counter 26 has counted three (3) memory data write clocks, in the next step S7, the initial counter 26 outputs an initial end signal and applies the same to the timing generator 18. Therefore, the timing generator 18 terminates the initial setting operation.

Figure 6:
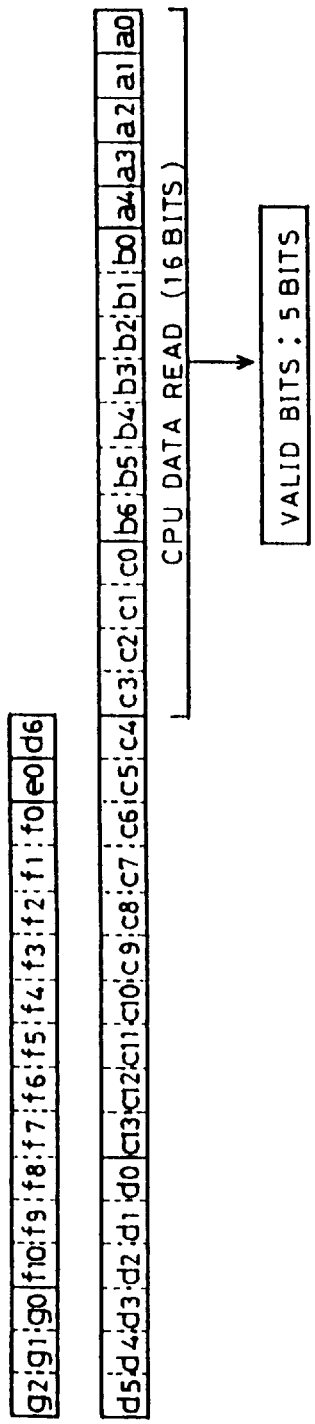
FIG. 6 is an illustrative view showing states of respective registers in explaining the operation of FIG. 1 embodiment.

Thus, as shown in FIG. 6, in the first register 12, the second register 20 and the third register 22, the data are respectively loaded. In the third register 22, in an order from the least significant bit, the data of 16 bits $a_0$, $a_1$, $a_2$, $a_3$, $a_4$, $b_0$, $b_1$, $b_2$, $b_3$, $b_4$, $b_5$, $b_6$, $c_0$, $c_1$, $c_2$, $c_3$ is loaded, and in the second register 20, in an order from the least significant bit, the data of 16 bits $c_4$, $c_5$, $c_6$, $c_7$, $c_8$, $c_9$, $c_{10}$, $c_{11}$, $c_{12}$, $c_{13}$, $d_0$, $d_1$, $d_2$, $d_3$, $d_4$, $d_5$ is loaded, and in the first register 12, in an order from the least significant bit, the data of 16 bits $d_6$, $e_0$, $f_0$, $f_1$, $f_2$, $f_3$, $f_4$, $f_5$, $f_6$, $f_7$, $f_8$, $f_9$, $f_{10}$, $g_0$, $g_1$, $g_2$ is loaded. The alphabet characters a, b, c, . . . indicate different data, respectively, and the number of the valid bits of the data a is 5 bits, the number of the valid bits of the data b is 7 bits, the number of the valid bits of the data c is 14 bits, the number of the valid bits of the data d is 7 bits, the number of the valid bits of the data e is 1 bit, the number of the valid bits of the data f is 11 bits, and the number of valid bits of the data g is unknown.

In a next step S8, the CPU (not shown) reads $a_0$–$a_4$ from the third register 22 as the valid data. In a step S9, as the CPU write data, "5" which is the number of the valid bits of the data a is outputted from the CPU. In response thereto, since the valid bit number write clock is outputted from the address decoder 36 (FIG. 3), data of "5" is written in the valid bit number register 28.

In a next step S10, the subtracter 30 performs a calculation operation of "the number of the remaining bits—the number of the valid bits". Now, the number of the remaining bits means data other than "0" which occurs in the data held in the second register 20 as a result of the barrel shift. For example, the data of 16 bits of $c_4$–$c_{13}$ and $d_0$–$d_6$ in FIG. 6 or the data of 11 bits of $c_9$–$c_{13}$ and $d_0$–$d_5$ in FIG. 7 is the remaining bits. In the example of FIG. 6, the number of the remaining bits of the second register 20 is "16", the subtraction result in the step S10 becomes positive because of "16–5=11", and therefore, "YES" is determined in the step S10. At this time, "5" that is the number of the valid bits is designated by the subtracter 30 to the barrel shifter 16 as the shift amount in the barrel shifter 16. Therefore, in a next step S11, data being barrel-shifted by the valid bit number "5" is loaded to the second register 20 and the third register 22. A result thereof is shown in FIG. 7. In FIG. 7, the data in the first register 12 is unchanged, and the data a of 5 bits held in the third register 22 is forced out the third register 22. Therefore, in the third register 22, the data of 16 bits $b_0$, $b_1$, $b_2$, $b_3$, $b_4$, $b_5$, $b_6$, $c_0$, $c_1$, $c_2$, $c_3$, $c_4$, $c_5$, $c_6$, $c_7$, $c_8$ is held. In addition, the borrow signal and the zero signal from the subtracter 30 are both "0", and therefore, the select signal of "0" is outputted from the timing generator 18. Accordingly, the selector 14 selects the data from the barrel shifter 16. Therefore, in the second register 20, the data of 11 bits $c_9$, $c_{10}$, $c_{11}$, $c_{12}$, $c_{13}$, $d_0$, $d_1$, $d_2$, $d_3$, $d_4$, $d_5$ and 5 bits of "0" are held. "0" is written in the second register 20 as a result of a fact that the data of the second register 20 is barrel-shifted by 5 bits by the barrel shifter 16.

Figure 8:
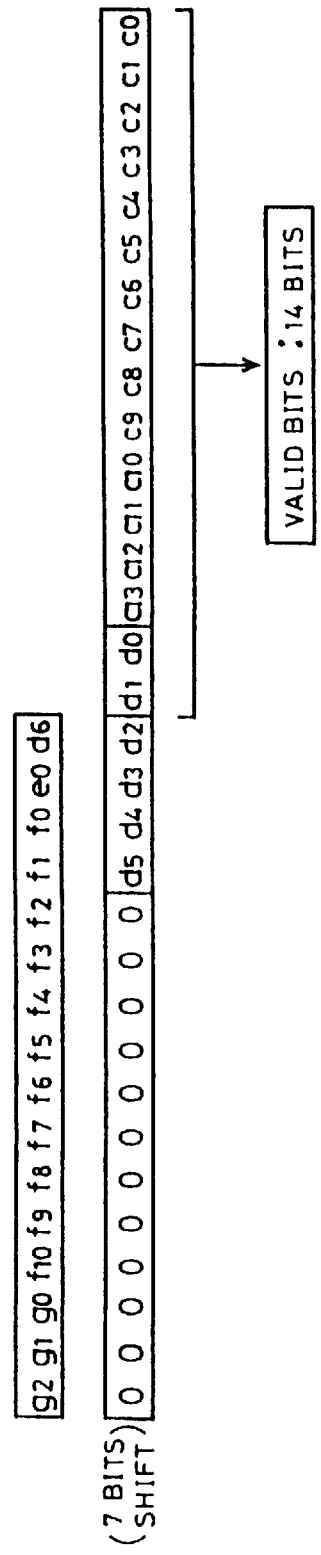
FIG. 8 is an illustrative view showing states of the respective registers in explaining the operation of FIG. 1 embodiment.

In a state of FIG. 7, the valid bit number of the data b in the third register 22 is "7", and the remaining bit number in the second register 20 is "11". Therefore, at this time, the steps S8 to S11 are repeatedly executed. As a result thereof, as shown in FIG. 8, the data b of 7 bits is discharged from the third register 22, and the data b is fetched as the CPU read data. Then, in the third register 22, the data of 16 bits $c_0$, $c_1$, $c_2$, $c_3$, $c_4$, $c_5$, $c_6$, $c_7$, $c_8$, $c_9$, $c_{10}$, $c_{11}$, $c_{12}$, $c_{13}$, $d_0$, $d_1$ is held, and in the second register 20, the data of 4 bits $d_2$, $d_3$, $d_4$, $d_5$ and 12 bits of "0" are held. Since "0" of 5 bits previously existed and the barrel shift of 7 bits are newly performed, at this stage, "0" in the second register 20 becomes 12 bits.

In a state of FIG. 8, the valid bit number of the data c in the third register 22 is "14", and the remaining bit number of the second register 20 is "4". Therefore, the subtraction result in the subtracter 30 becomes "4−14=−10", and therefore, the borrow signal is outputted, and accordingly, "NO" is determined in the step S10. Therefore, the process proceeds to a step S12 shown in FIG. 5. In the step S12, it is determined whether or not the subtraction result of "the remaining bit number—the valid bit number" is "0". In the above described example, since the subtraction result is "−10", "NO" is determined in the step S12, and therefore, the process proceeds to a step S13.

Figure 9:
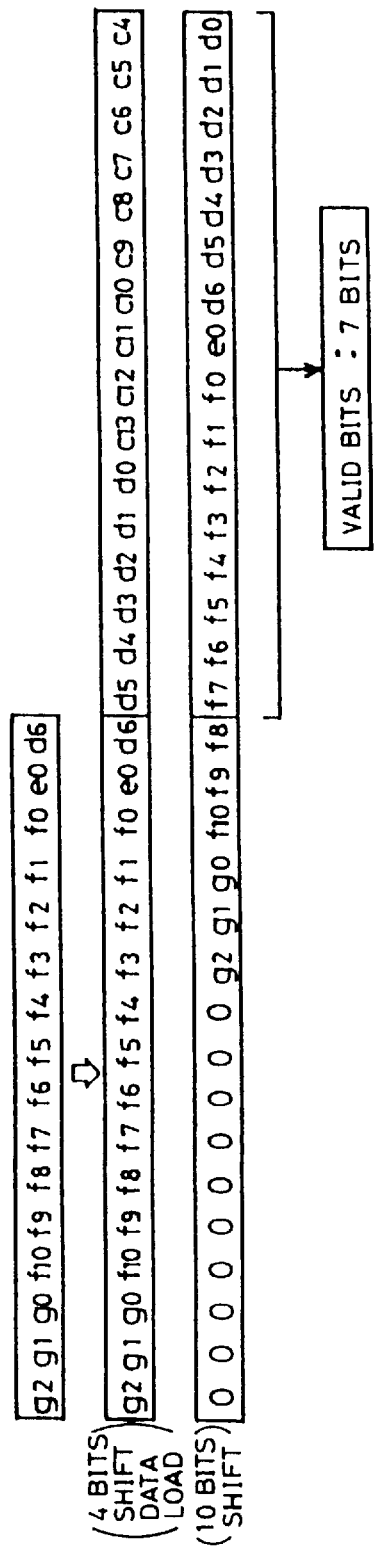
FIG. 9 is an illustrative view showing states of the respective registers in explaining the operation of FIG. 1 embodiment.

In response to the borrow signal, the timing generator 18 outputs the select signal of "0". Furthermore, the subtracter 30 applies "4" being the remaining bit number to the barrel shifter 16 as the shift amount because the subtraction result becomes negative. Therefore, in the step S13, as shown in FIG. 9, the data in the second register 20 and the third register 22 is barrel-shifted by 4 bits, and resultant data is loaded to the second register 20 and the third register 22. At this time, the data of lower 16 bits in the barrel shifter 16 becomes $c_4$, $c_5$, $c_6$, $c_7$, $c_8$, $c_9$, $c_{10}$, $c_{11}$, $c_{12}$, $c_{13}$, $d_0$, $d_1$, $d_2$, $d_3$, $d_4$, $d_5$, and the upper 16 bits become all "0". Since the selector 14 next selects the data of the first register 12 in response to the select signal of "1" from the timing generator 18, the data of the first register 12 is loaded to the second register 20 in a bit-parallel fashion, and the second register 20 holds the data of 16 bits $d_6$, $e_0$, $f_0$, $f_1$, $f_2$, $f_3$, $f_4$, $f_5$, $f_6$, $f_7$, $f_8$, $f_9$, $f_{10}$, $g_{10}$, $g_{11}$, $g_{12}$.

In a next step S14, the shift amount of "valid bit number—remaining bit number" is designated by the subtracter 30 for the barrel shifter 16. In the state of FIG. 8, the valid bit number of the third register 22 is "14" and the remaining bit number of the second register 20 is "4". Therefore, the shift amount at that time is "10". Accordingly, in the step S14, the data obtained by barrel-shifting the data of the second register 20 and the third register 22 by 10 bits by the barrel shifter 16 is loaded to the second register 20 and the third register 22 through the selector 14. As a result thereof, in the third register 22, the data of 16 bits $d_0$, $d_1$, $d_2$, $d_3$, $d_4$, $d_5$, $d_6$, $e_0$, $f_0$, $f_1$, $f_2$, $f_3$, $f_4$, $f_5$, $f_6$, $f_7$ is held, and in the second register 20, the data of 6 bits $f_8$, $f_9$, $f_{10}$, $g_0$, $g_1$, $g_2$ and "0" of 10 bits are held.

In a next step S15, the VBC request signal is outputted from the timing generator 18, and in response thereto, the next memory data is read from the memory (not shown). Therefore, in a step S16, as shown in FIG. 10, the memory data is loaded to the first register 12 in a bit-parallel fashion, and accordingly, the data of 16 bits $g_3$, $g_4$, $g_5$, $g_6$, $g_7$, $h_0$, $h_1$, $h_2$, $h_3$, $h_4$, $h_5$, $h_6$, $h_7$, $h_8$, $h_9$, $h_{10}$ is held in the first register 12.

In addition, since the timing generator 18 increments the memory address counter 34 at every timing that the data is loaded from the memory to the first register 12, only by a variable bit-length code train is stored in the memory in sequential addresses, respective variable bit-length codes are automatically and sequentially loaded to the first register 12 from the memory.

When the step S12 is executed again, in a state of FIG. 9, the valid bit number of the data a in the third register 22 is "7", and the remaining bit number is "4", and therefore, steps S13 to S16 are executed. More specifically, after the step S13, as shown in FIG. 10, the data of 16 bits $d_6$, $e_0$, $f_0$, $f_1$, $f_2$, $f_3$, $f_4$, $f_5$, $f_6$, $f_7$, $f_8$, $f_9$, $f_{10}$, $g_0$, $g_1$, $g_2$, $g_3$ is held in the third register 22, and in the second register 20, the data of 16 bits $g_3$, $g_4$, $g_5$, $g_6$, $g_7$, $h_0$, $h_1$, $h_2$, $h_3$, $h_4$, $h_5$, $h_6$, $h_7$, $h_8$, $h_9$, $h_{10}$ is held. At the same time, the data d of 7 bits is fetched as the CPU read data. After succeeding steps S15 and S16, as shown in FIG. 10, the data of 16 bits $d_0$, $e_0$, $f_0$, $f_1$, $f_2$, $f_3$, $f_4$, $f_5$, $f_6$, $f_7$, $f_8$, $f_9$, $f_{10}$, $g_0$, $g_1$, $g_2$ is held in the third register 22, and the data of 15 bits of $g_4$, $g_5$, $g_6$, $g_7$, $h_0$, $h_1$, $h_2$, $h_3$, $h_4$, $h_5$, $h_6$, $h_7$, $h_8$, $h_9$, $h_{10}$ and "0" of 1 bit are held in the second register 20, and in the first register 12, the memory data $h_{11}$, $h_{12}$, $h_{13}$, $h_{14}$, $h_{15}$, $i_0$, $i_1$, $i_2$, $i_3$, $i_4$, $i_5$, $i_6$, $i_7$, $i_8$, $i_9$, $j_0$ from the memory (not shown) is loaded.

Figure 10:
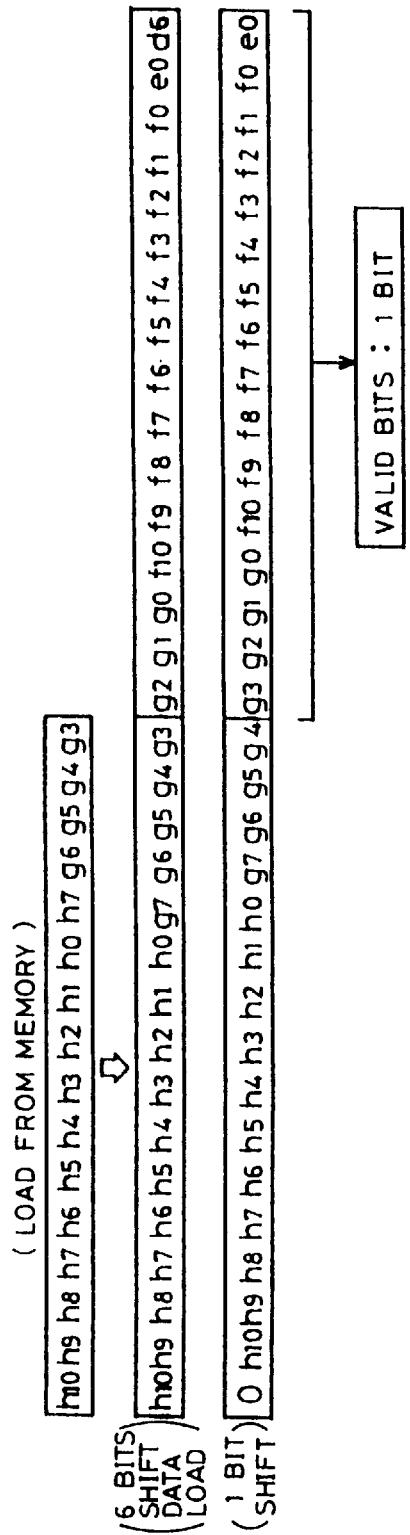
FIG. 10 is an illustrative view showing states of the respective registers in explaining the operation of FIG. 1 embodiment.

In a state of FIG. 10, the number of the valid bits of the data e in the third register 22 is "1", and the remaining bit number is "15", and therefore, "YES" is determined in the step S10 to be executed succeeding, and therefore, the step S11 is executed again. As a result thereof, as shown in FIG. 11, in the third register 22, the data of 16 bits $f_0$, $f_1$, $f_2$, $f_3$, $f_4$, $f_5$, $f_6$, $f_7$, $g_0$, $g_1$, $g_2$, $g_3$, $g_4$ is held, and in the second register 20, the data of 14 bits $g_5$, $g_6$, $g_7$, $h_0$, $h_1$, $h_2$, $h_3$, $h_4$, $h_5$, $h_6$, $h_7$, $h_8$, $h_9$, of 2 bits are held.

Figure 11:
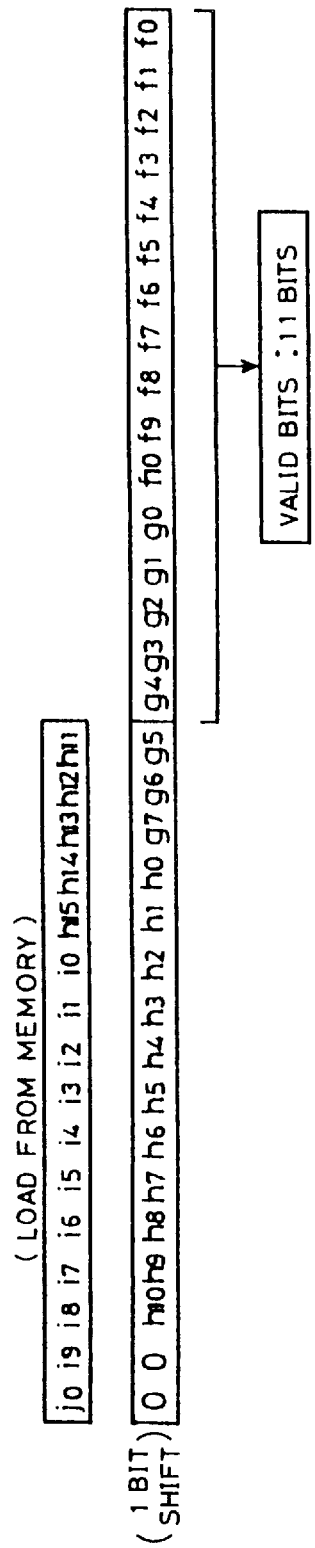
FIG. 11 is an illustrative view showing states of the respective registers in explaining the operation of FIG. 1 embodiment.
Figure 12:
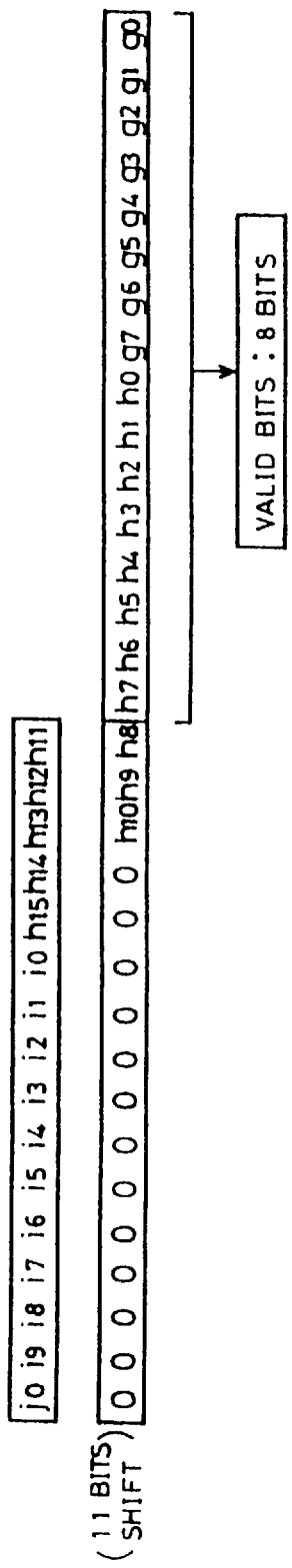
FIG. 12 is an illustrative view showing states of the respective registers in explaining the operation of FIG. 1 embodiment.

In a state of FIG. 11, the number of the valid bits of the data f in the third register 22 is "11", and the remaining bit number is "14", and therefore, "YES" is determined in the step S10 to be succeedingly executed, and therefore, the step S11 is executed again. As a result thereof, as shown in FIG. 12, in the third register 22, the data of 16 bits $g_0$, $g_1$, $g_2$, $g_3$, $g_4$, $g_5$, $g_6$, $g_7$, $h_0$, $h_1$, $h_2$, $h_3$, $h_4$, $h_5$, $h_6$, $h_7$ is held, and in the second register 20, the data of 13 bits $h_8$, $h_9$, $h_{10}$, and "0" of 13 bits are held. At this time, the data in the first register 12 is unchanged as $h_{11}$, $h_{12}$, $h_{13}$, $h_{14}$, $h_{15}$, $i_0$, $i_1$, $i_2$, $i_3$, $i_4$, $i_5$, $i_6$, $i_7$, $i_8$, $i_9$, $j_0$.

In a state of FIG. 12, the valid bit number of the data g in the third register 22 is "8", and the remaining bit number is "3", and therefore, in the steps S10 and S12, "NO" is determined, respectively. Therefore, the steps S13 to S16 are repeatedly executed again. A result thereof is shown in FIG. 13.

Figure 13:
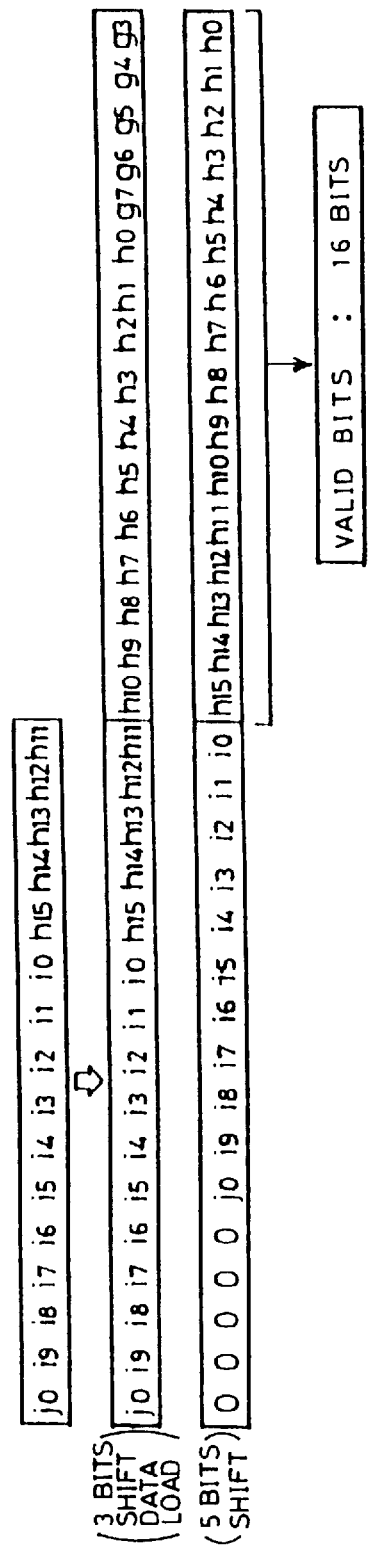
FIG. 13 is an illustrative view showing states of the respective registers in explaining the operation of FIG. 1 embodiment.

In a state of FIG. 13, the valid bit number of the data h in the third register 22 is "16", and the remaining bit number of the second register 20 is "11". Therefore, the subtraction result in the subtracter 30 becomes "11−16=−5", and therefore, the borrow signal is outputted, and accordingly, "NO" is determined in the step S10. Therefore, in the step S12, it is determined whether or not the subtraction result of "the remaining bit number—the valid bit number" is "0". In the above described example, since the subtraction result is "−5", "NO" is determined in the step S12, and therefore, the process proceeds to a step S13.

Figure 14:
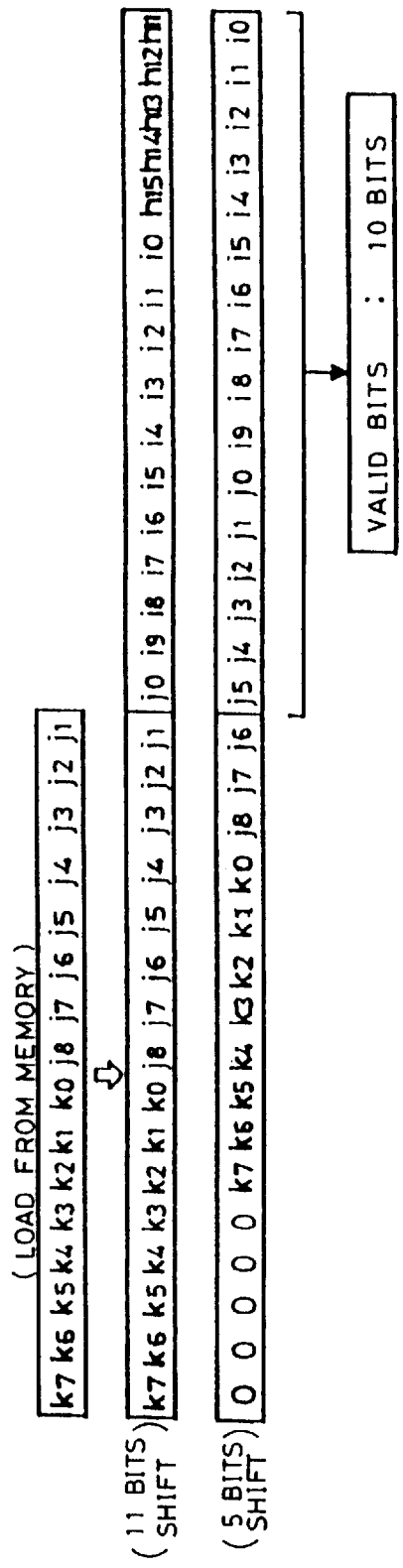
FIG. 14 is an illustrative view showing states of the respective registers in explaining the operation of FIG. 1 embodiment.

In response to the borrow signal, the timing generator 18 outputs the select signal of "0". Furthermore, the subtracter 30 applies "11" being the remaining bit number to the barrel shifter 16 as the shift amount because the subtraction result becomes negative. Therefore, in the step S13, as shown in FIG. 14, the data in the second register 20 and the third register 22 is barrel-shifted by 11 bits, and resulted 20 data is loaded to the second register 20 and the third register 22. At this time, the data of the lower 16 bits in the barrel shifter 16 becomes $h_{11}$, $h_{12}$, $h_{13}$, $h_{14}$, $h_{15}$, $i_0$, $i_1$, $i_2$, $i_3$, $i_4$, $i_5$, $i_6$, $i_7$, $i_8$, $i_9$, $j_0$, and the upper 16 bits become all "0". Since the selector 14 next selects the data of the first register 12 in response to the select signal of "1" from the timing generator 18, the data of the first register 12 is loaded to the second register 20 in a bit-parallel fashion, and the second register 20 holds the data of 16 bits $j_1$, $j_2$, $j_3$, $j_4$, $j_5$, $j_6$, $j_7$, $j_8$, $k_0$, $k_1$, $k_2$, $k_3$, $k_4$, $k_5$, $k_6$, $k_7$.

In the next step S14, the shift amount of "valid bit number—remaining bit number" is designated from the subtracter 30 to the barrel shifter 16. In a state of FIG. 14, the valid bit number of the third register 22 is "16" and the remaining bit number of the second register 20 is "11". Therefore, the shift amount at that time is "5". Accordingly, in the step S14, the data obtained by barrel-shifting the data of the second register 20 and the third register 22 by 5 bits by the barrel shifter 16 is loaded to the second register 20 and the third register 22 through the selector 14. As a result thereof, in the third register 22, the data of 16 bits $i_0$, $i_1$, $i_2$, $i_3$, $i_4$, $i_5$, $i_6$, $i_7$, $i_8$, $i_9$, $j_0$, $j_1$, $j_2$, $j_3$, $j_4$, $j_5$ is held, and in the second register 20, the data of 11 bits $j_6$, $j_7$, $j_8$, $k_0$, $k_1$, $k_2$, $k_3$, $k_4$, $k_5$, $k_6$, $k_7$ and "0" of 5 bits are held.

In the next step S15, the VBC request signal is outputted from the timing generator 18, and in response thereto, the next memory data is read from the memory (not shown). Therefore, in a step S16, as shown in FIG. 15, the memory data is loaded to the first register 12 in a bit-parallel fashion, and accordingly, the data of 16 bits $l_0$, $l_1$, $l_2$, $l_3$, $l_4$, $m_0$, $m_1$, $n_0$, $n_1$, $n_2$, $s_0$, $s_1$, $s_2$, $s_3$, $s_4$, $s_5$, is held in the first register 12.

In the state of FIG. 14, the number of the valid bits of the data i in the third register 22 is "10", and the number of the remaining bits in the second register 20 is "11". Therefore, the subtraction result in the subtracter 30 becomes "11−10= 1", and therefore, "YES" is determined in the step S10. At this time, "10" equal to the number of the valid bits is applied to the barrel shifter 16 from the subtracter 30 as the shift amount in the barrel shifter 16. Therefore, in the next step S11, the data barrel-shifted by the number of the valid bits, i.e. "10" is loaded to the second register 20 and the third register 22. A result thereof is shown in FIG. 15. In FIG. 15, the data in the first register 12 is unchanged, and the data i of 10 bits held in the third register 22 is pushed-out from the third register 22. Therefore, in the third register 22, the data of 16 bits $j_0$, $j_1$, $j_2$, $j_3$, $j_4$, $j_5$, $j_6$, $j_7$, $j_5$, $j_6$, $j_7$, $j_8$, $k_0$, $k_1$, $k_2$, $k_3$, $k_4$, is held. In addition, the borrow signal and the zero signal from the subtracter 30 are both "0", and therefore, the select signal of "0" is outputted from the timing generator 18. Accordingly, the selector 14 selects the data from the barrel shifter 16. Therefore, in the second register 20, the data of 1 bit $k_7$ and "0" of 15 bits are held. "0" is written in the second register 20 because the data in the second register 20 is barrel-shifted by 10 bits by the barrel shifter 16.

Figure 15:
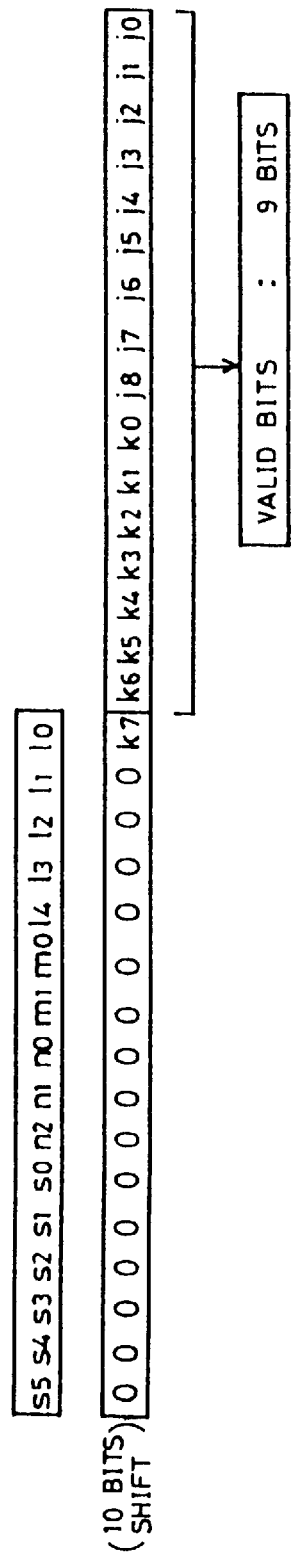
FIG. 15 is an illustrative view showing states of the respective registers in explaining the operation of FIG. 1 embodiment.

In a state of FIG. 15, the valid bit number of the data j in the third register 22 is "9", and the remaining bit number of the second register 20 is "1". Therefore, the subtraction result in the subtracter 30 becomes "1−9=−8", and therefore, the borrow signal is outputted, and accordingly, "NO" is determined in the step S10. Therefore, in the step S12, it is determined whether or not the subtraction result of "the remaining bit number—the valid bit number" is "0". In the above described example, since the subtraction result is "−8", "NO" is determined in the step S12, and therefore, the process proceeds to the step S13.

Figure 16:
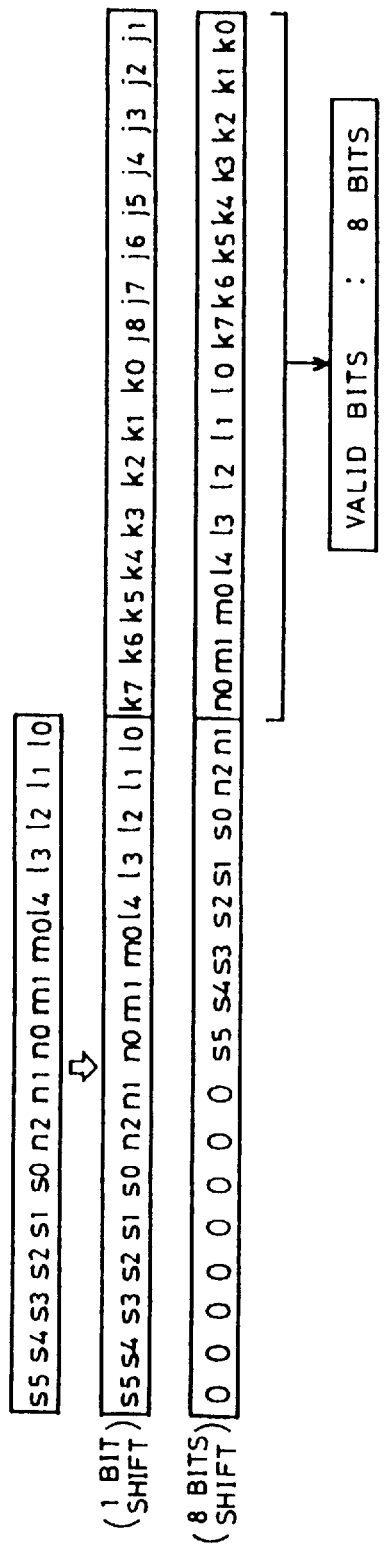
FIG. 16 is an illustrative view showing states of the respective registers in explaining the operation of FIG. 1 embodiment.

In response to the borrow signal, the timing generator 18 outputs the select signal of "0". Furthermore, the subtracter 30 applies "1" being the remaining bit number to the barrel shifter 16 as the shift amount because the subtraction result becomes negative. Therefore, in the step S13, as shown in FIG. 16, the data in the second register 20 and the third register 22 is barrel-shifted by 1 bits, and resulted data is loaded to the second register 20 and the third register 22. At this time, the data of the lower 16 bits in the barrel shifter 16 becomes $j_1$, $j_2$, $j_3$, $j_4$, $j_5$, $j_6$, $j_7$, $j_8$, $k_0$, $k_1$, $k_2$, $k_3$, $k_4$, $k_5$, $k_6$, $k_7$, and the upper 16 bits become all "0". Since the selector 14 next selects the data of the first register 12 in response to the select signal of "1" from the timing generator 18, the data of the first register 12 is loaded to the second register 20 in a bit-parallel fashion, and the second register 20 holds the data of 16 bits $l_0$, $l_1$, $l_2$, $l_3$, $l_4$, $m_0$, $m_1$, $n_0$, $n_1$, $n_2$, $s_0$, $s_1$, $s_2$, $s_3$, $s_4$, $s_5$.

In the next step S14, the shift amount of "valid bit number—remaining bit number" is designated from the subtracter 30 to the barrel shifter 16. In the state of FIG. 15, the valid bit number of the third register 22 is "9" and the remaining bit number of the second register 20 is "1". Therefore, the shift amount at that time is "8". Accordingly, in the step S14, the data obtained by barrel-shifting the data of the second register 20 and the third register 22 by 8 bits by the barrel shifter 16 is loaded to the second register 20 and the third register 22 through the selector 14. As a result thereof, in the third register 22, the data of 16 bits $k_0$, $k_1$, $k_2$, $k_3$, $k_4$, $k_5$, $k_6$, $k_7$, $l_0$, $l_1$, $l_2$, $l_3$, $l_4$, $m_0$, $m_1$, $n_0$ is held, and in the second register 20, the data of 8 bits $n_1$, $n_2$, $s_0$, $s_1$, $s_2$, $s_3$, $s_4$, $s_5$ and "0" of 8 bits are held.

Figure 17:
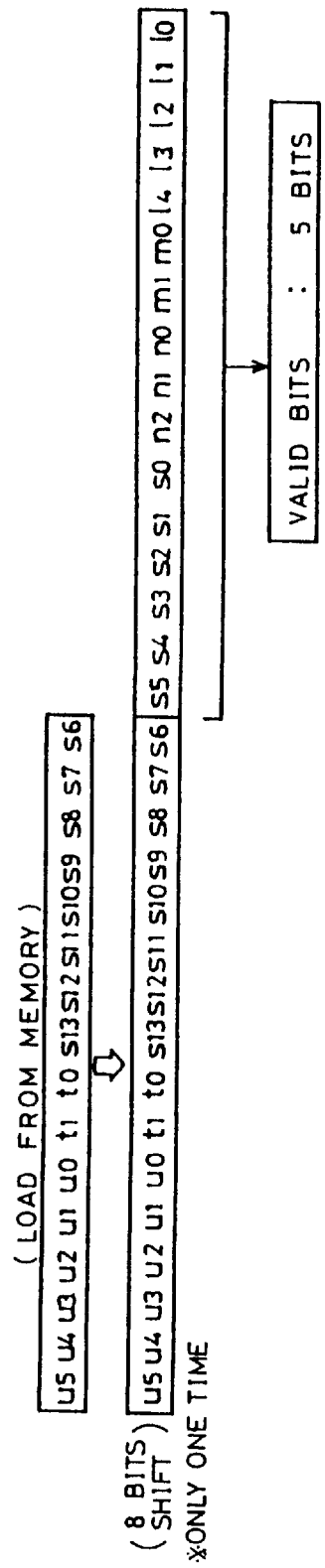
FIG. 17 is an illustrative view showing states of the respective registers in explaining the operation of FIG. 1 embodiment.

In the next step S15, the VBC request signal is outputted from the timing generator 18, and in response thereto, the next memory data is read from the memory (not shown). Therefore, in the step S16, as shown in FIG. 17, the memory data is loaded to the first register 12 in a bit-parallel fashion, and accordingly, the data of 16 bits $s_6$, $s_7$, $s_8$, $s_9$, $s_{10}$, $s_{11}$, $s_{12}$, $s_{13}$, $t_0$, $t_1$, $u_0$, $u_1$, $u_2$, $u_3$, $u_4$, $u_5$ is held in the first register 12.

If the step S12 executed again, in a state of FIG. 16, the number of the valid bits of the data k in the third register 22 is "8", and the remaining bit number is "8", and therefore, steps S17 to S19 are executed.

First, in the step S17, the selector 14 selects the data in the first register 12 in response to the select signal of "1" from the timing generator 18, and therefore, the data of the first register 12 is loaded to the second register 20 in a bit-parallel fashion, and in the second register 20, the data of 16 bits $s_6$, $s_7$, $s_8$, $s_9$, $s_{10}$, $s_{11}$, $s_{12}$, $s_{13}$, $t_0$, $t_1$, $u_0$, $u_1$, $u_2$, $u_3$, $u_4$, $u_5$ is held. At this time, the shift amount equal to the number of the valid bits is applied to the barrel shifter 16 from the subtracter 30. In a state of FIG. 16, the number of the valid bits in the second register 22 is "8". Therefore, the shift amount at that time is "8". Accordingly, in the step S17, the data obtained by barrel-shifting the data in the second register 20 and the third register 22 by the barrel shifter 16 by 8 bits is loaded to the second register 20 and the third register 22 through the selector 14. As a result thereof, the data k of 8 bits being held in the third register 22 is forced out from the third register 22. Then, as shown in FIG. 17, in the third register 22, the data of 16 bits $l_0, l_1, l_2, l_3, l_4, m_0, m_1, n_0, n_1, n_2, s_0, s_1, s_2, s_3, s_4, s_5$ is held, and in the second register 20, the data of 16 bits $s_6, s_7, s_8, s_9, s_{10}, s_{11}, s_{12}, s_{13}, t_0, t_1, u_0, u_1, u_2, u_3, u_4, u_5$ is held.

In the next step 16, the VBC request signal is generated from the timing generator 18, and therefore, next memory data is read from the memory (not shown). Therefore, in the step S19, as shown in FIG. 18, the memory data is loaded to the first register 12 in a bit-parallel fashion, and therefore, the first register 12 holds the data of 16 bits $u_6, u_7, v_0, v_1, v_2, v_3, v_4, w_0, w_1, w_2, w_3, w_4, w_5, w_6, w_7, x_0$.

In a state of FIG. 17, the number of the valid bits of the data l in the third register 22 is "5", and the number of the remaining bits in the second register 20 is "16". Therefore, the subtraction result in the subtracter 30 becomes "16−5=11", and therefore, "YES" is determined in the step S10. At this time, "5" equal to the number of the valid bits is applied to the barrel shifter 16 from the subtracter 30 as the shift amount in the barrel shifter 16. Therefore, in the next step S11, the data barrel-shifted by the number of the valid bits, i.e. "5" is loaded to the second register 20 and the third register 22. A result thereof is shown at an upper portion in FIG. 18. In this state, the data in the first register 12 is unchanged, and the data l of 5 bits held in the third register 22 is pushed-out from the third register 22. Therefore, in the third register 22, the data of 16 bits $m_0, m_1, n_0, n_1, n_2, s_0, s_1, s_2, s_3, s_4, s_5, s_6, s_7, s_8, s_9, s_{10}$ is held. In addition, the borrow signal and the zero signal from the subtracter 30 are both "0", and therefore, the select signal of "0" is outputted from the timing generator 18. Accordingly, the selector 14 selects the data from the barrel shifter 16. Therefore, in the second register 20, the data of 11 bits $s_{11}, s_{12}, s_{13}, t_0, t_1, u_0, u_1, u_2, u_3, u_4, u_5$ and "0" of 5 bits are held. "0" is written in the second register 20 because the data in the second register 20 is barrel-shifted by 5 bits by the barrel shifter 16.

Figure 18:
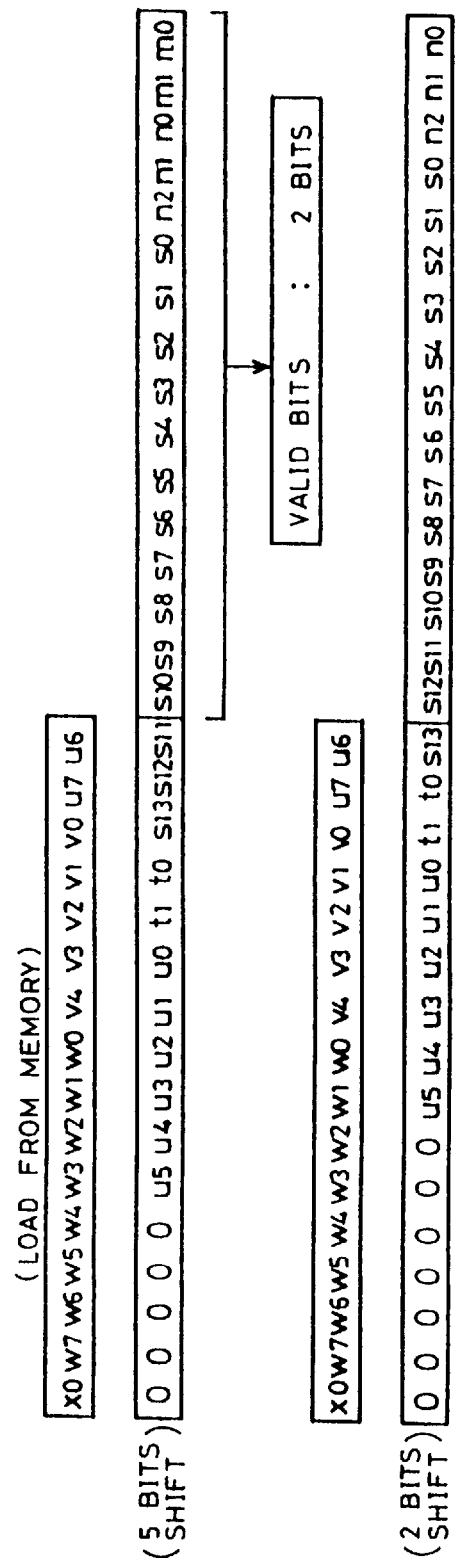
FIG. 18 is an illustrative view showing states of the respective registers in explaining the operation of FIG. 1 embodiment.

In a state of the upper portion in FIG. 18, the number of the valid bits of the data m in the third register 22 is "2", and the number of the remaining bits in the second register 20 is "11". Therefore, the subtraction result in the subtracter 30 becomes "11−2=9", and therefore, "YES" is determined in the step S10. At this time, "2" equal to the number of the valid bits is applied to the barrel shifter 16 from the subtracter 30 as the shift amount in the barrel shifter 16. Therefore, in the next step S11, the data barrel-shifted by the number of the valid bits, i.e. "2" is loaded to the second register 20 and the third register 22. A result thereof is shown at a lower portion in FIG. 18. In the lower portion of FIG. 18, the data in the first register 12 is unchanged, and the data m of 12 bits held in the third register 22 is pushed-out from the third register 22. Therefore, in the third register 22, the data of 16 bits $n_0, n_1, n_2, s_0, s_1, s_2, s_3, s_4, s_5, s_6, s_7, s_8, s_9, s_{10}, s_{11}, s_{12}$ is held. In addition, the borrow signal and the zero signal from the subtracter 30 are both "0", and therefore, the select signal of "0" is outputted from the timing generator 18. Accordingly, the selector 14 selects the data from the barrel shifter 16. Therefore, in the second register 20, the data of 9 bits $s_{13}, t_0, t_1, u_0, u_1, u_2, u_3, u_4, u_5$ and "0" of 7 bits are held. "0" is written in the second register 20 because the data in the second register 20 is barrel-shifted by 2 bits by the barrel shifter 16.

Thus, in the above described embodiment, only by performing the barrel shift operations twice at most, the valid data can be withdrawn from the third register 22.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A compressed data expanding circuit, comprising:
   a first 1-word register which holds compressed data applied from a memory in a bit-parallel fashion;
   a second 1-word register which receives, for holding, the compressed data from said first register in a bit-parallel fashion;
   a third 1-word register which in operation is loaded with a variable bit-length code composed of valid bits and non-valid bits;
   a comparison means which compares the number of valid bits with the number of remaining bits of the data held in said second register to output a comparison signal based on the result of comparison and sets a shift amount corresponding to the comparison signal;
   a barrel shift means which in operation is loaded with the data of the second register as high order data and the data of said third register as lower order data to barrel shift by the shift amount both of the higher order data and the lower order data in response to the shift amount outputted from said comparison means, and thereafter supplies the higher order data to said second register and the lower order data to said third register;
   a selecting signal output means which outputs a selecting signal for selecting one of the compressed data in said first register and the higher order data in said barrel shift means in response to the comparison signal outputted from said comparison means
   a selecting means which selectively outputs one of the compressed data in said first register and the higher order data in said barrel shift means based on the selecting signal so as to load to said second register in a bit parallel fashion; and
   an output means which withdraws a variable bit-length code in which the non-valid bits are added to said compressed data.

2. A compressed data expanding circuit according to claim 1, wherein said comparison means outputs a comparison signal corresponding to a first shift amount when the valid bit number and the remaining bit number are equal to each other,
   said barrel shift means loading the respective data of said second register and said third register as higher order data and lower order data to barrel-shift both of the higher order bits and lower order bits by the remaining bit number in response to the first shift amount from said comparison means, to thereby supply the lower order bits to said third register, and
   said selecting means operating in response to the comparison signal to selectively output the compressed data in said first register to said second register in response to the result of comparison by said comparison means so as to load to said second register in bit-parallel fashion.

3. A compressed data expanding circuit according to claim 2, wherein said comparison means outputs a comparison signal corresponding to a third shift amount for shifting by the valid bit number when said remaining bit number is larger than said valid bit number, said barrel shift means being loaded with the respective data of said second register and said third register as higher order data and lower order data to barrel-shift both of the higher order data and the lower order data by the remaining bit number in response to the third shift amount from said comparison means, to thereby supply the higher order data and the lower order data respectively to said second register and said third register, and said selecting means operating in response to the comparison signal to selectively output the higher order data obtained by the barrel shifting so as to load to said second register in bit-parallel fashion.

4. A compressed data expanding circuit according to claim 1, wherein said comparison means outputs a comparison signal corresponding to a third shift amount for shifting by the valid bit number when said remaining bit number is larger than said valid bit number, said barrel shift means being loaded with the respective data of said second register and said third register as higher order data and lower order data to barrel-shift both of the higher order data and the lower order data by the remaining bit number in response to the third shift amount from said comparison means, to thereby supply the higher order data and the lower order data respectively to said second register and said third register, and said selecting means operating in response to the comparison signal to selectively output the higher order data obtained by the barrel shifting so as to load to said second register in bit-parallel fashion.

5. A compressed data expanding circuit according to claim 1, wherein said comparison means outputs a comparison signal corresponding to a first shift amount for shifting by the remaining bit number and a second shift amount for shifting by a differential bit number between the valid bit number and the remaining bit number at a time that the valid bit number is greater than the remaining bit number, said barrel shift means being loaded with the data of said second and third register as higher order data and lower order data to barrel-shift by the remaining bit number both of the higher order data and the lower order data in response to the first shift amount from said comparison means, to thereby supply the lower order data to said third register, said selecting means operating in response to the comparison signal to selectively output the compressed data in said first register in response to the result of comparison by said comparison means to load the outputted compressed data to said second register, said barrel shift means being loaded with the respective data of said second register and said third register as higher order data and lower order data after said selecting means loads the compressed data in said first register to said second register, and barrel-shift both the higher order bits and the lower order bits by the differential bit number between the valid bit number and the remaining bit number in response to the second shift amount from said comparison means, to thereby supply the higher order bits and the lower order bits respectively to said second register and said third register, and said selecting means selectively outputting, for loading in bit-parallel fashion to said second register, the higher order bits obtained by the barrel shifting.

6. A compressed data expanding circuit according to claim 5, wherein said comparison means outputs a comparison signal corresponding to first shift amount when the valid bit number and the remaining bit number are equal to each other, said barrel shift means loading the respective data of said second register and said third register as higher order data and lower order data to barrel-shift both of the higher order bits and lower order bits by the remaining bit number in response to the first shift amount from said comparison means, to thereby supply the lower order bits to said third register, and said selecting means operating in response to the comparison signal to selectively output the compressed data in said first register to said second register in response to the result of comparison by said comparison means so as to load to said second register in bit-parallel fashion.

7. A compressed data expanding circuit according to claim 5, wherein said comparison means outputs a comparison signal corresponding to a third shift amount for shifting by the valid bit number when said remaining bit number is larger than said valid bit number, said barrel shift means being loaded with the respective data of said second register and said third register as higher order data and lower order data to barrel-shift both of the higher order data and the lower order data by the remaining bit number in response to the third shift amount from said comparison means, to thereby supply the higher order data and the lower order data respectively to said second register and said third register, and said selecting means operating in response to the comparison signal to selectively output the higher order data obtained by the barrel shifting so as to load to said second register in bit-parallel fashion.

8. A processing method in a compressed data expanding circuit which comprises a first 1-word register which holds compressed data applied in a bit-parallel fashion, a second 1-word register which receives, for holding the compressed data from said first register in a bit-parallel fashion, and a third 1-word register which in operation is loaded with a variable bit-length code composed of valid bits and non-valid bits, and, wherein when the number of valid bits is larger than the number of remaining bits of the data held in second register, the method includes the steps of:

(a) loading the data of said second register as higher order data and the data of said third register as lower order data to barrel shift by a shift amount both of the higher order data and the lower order data;

(b) loading the compressed data of said first register to said second register in a bit-parallel fashion;

(c) loading the data of said second register as high order data and the data of said third register as lower order data to barrel shift by a number of bits equal to a difference between the number of the valid bits and the number of the remaining bits; and withdrawing a variable bit-length code in which the non-valid bits are added to said compressed data from said third register.

9. A processing method according to claim 8, wherein when the valid bit number and the remaining bit number are equal to each other, the method includes the steps of (d) loading data of said second register as higher order data and the data of said third register as lower order data to barrel shift by said remaining bit number, and (e) loading the compressed data in said first register to said second register in a bit-parallel fashion; and withdrawing said variable bit-length code in which the non-valid bits are added to said compressed data from said third register.

10. A processing method according to claim 9, wherein when the valid bit number and the remaining bit number are equal to each other, the method includes the steps of (d) loading data of said second register as high order data and the data of said third register as lower order data to barrel shift by said remaining bit number, and (e) loading the compressed data in said first register to said second register in a bit-parallel fashion; and withdrawing said variable bit-length code in which the non-valid bits are added to said compressed data from said third register.

11. A processing method according to claim 8, wherein when said remaining bit number is larger than said valid bit number the method includes the steps of (f) loading the data in said second register as high order data and the data of said third register as lower order data to barrel shift by said valid bit number; and withdrawing said variable bit-length code in which the non-valid bits are added to said compressed data from said third register.

12. A compressed data expanding circuit, comprising:

a first 1-word register which holds compressed data applied from a memory in a bit-parallel fashion;

a second 1-word register which receives, for holding, the compressed data from said first register in a bit-parallel fashion;

a third 1-word register which is loaded with a variable bit-length code composed of valid bits and non-valid bits;

a shift amount determination circuit which compares the number of valid bits with the number of remaining bits of the data held in said second register to output a comparison signal based on the result of the comparison and sets a shift amount corresponding to the comparison signal;

a barrel shifter operable to be loaded with the data of the second register as high order data and the data of said third register as lower order data and to barrel shift by the shift amount both of the higher order data and the lower order data in response to the shift amount outputted from said shift amount determination circuit, and thereafter supplies the higher order data to said second register and the lower order data to said third register;

a signal output selector operable to output a selecting signal for selecting one of the compressed data in said first register and the higher order data in said barrel shift means in response to the comparison signal outputted from said shift amount determination circuit a compressed data selector which selectively outputs one of the compressed data in said first register and the higher order data in said barrel shifter based on the selecting signal so as to load to said second register in a bit parallel fashion; and an output device which withdraws a variable bit-length code in which the non-valid bits are added to said compressed data.

13. A compressed data expanding circuit according to claim 12, wherein said shift amount determination circuit outputs a comparison signal corresponding to first shift amount when the valid bit number and the remaining bit number are equal to each other, said barrel shifter being operable to load the respective data of said second register and said third register as higher order data and lower order data to barrel-shift both of the higher order bits and lower order bits by the remaining bit number in response to the first shift amount from said shift amount determination circuit, to thereby supply the lower order bits to said third register, and said selector being operable in response to the comparison signal to selectively output the compressed data in said first register to said second register in response to the result of comparison by said shift amount determination circuit to load to said second register in bit-parallel fashion.

14. A compressed data expanding circuit according to claim 13, wherein said shift amount determination circuit is further operable to output a comparison signal corresponding to a third shift amount for shifting by the valid bit number when said remaining bit number is larger than said valid bit number, said barrel shifter being loaded with the respective data of said second register and said third register as higher order data and lower order data to barrel-shift both of the higher order data and the lower order data by the remaining bit number in response to the third shift amount from said shift amount determination circuit, to thereby supply the higher order data and the lower order data respectively to said second register and said third register, and said selector being operable in response to the comparison signal to means selectively output the higher order data obtained by the barrel shifting to load to said second register in bit-parallel fashion.

15. A compressed data expanding circuit according to claim 12, wherein said shift amount determination circuit outputs a comparison signal corresponding to a third shift amount for shifting by the valid bit number when said remaining bit number is larger than said valid bit number, said barrel shifter being loaded with the respective data of said second register and said third register as higher order data and lower order data to barrel-shift both of the higher order data and the lower order data by the remaining bit number in response to the third shift amount from said shift amount determination circuit, to thereby supply the higher order data and the lower order data respectively to said second register and said third register, and said selector being operable in response to the comparison signal to selectively output the higher order data obtained by the barrel shifting to load to said second register in bit-parallel fashion.

16. A compressed data expanding circuit according to claim 12, wherein said shift amount determination circuit outputs a comparison signal corresponding to a first shift amount for shifting by the remaining bit number and a second shift amount for shifting by a differential bit number between the valid bit number and the remaining bit number when the valid bit number is greater than the remaining bit number, said barrel shifter being loaded with the data of said second and third register as higher order data and lower order data to barrel-shift by the remaining bit number both of the higher order data and the lower order data in response to the first shift amount from said shift amount determination circuit, to thereby supply the lower order data to said third register, said selector being operable in response to the comparison signal to selectively output the compressed data in said first register in response to the result of comparison by said shift amount determination circuit to load the outputted compressed data to said second register, said barrel shifter being loaded with the respective data of said second register and said third register as higher order data and lower order data after said selector loads the compressed data in said first register to said second register, and being operable to barrel-shift both the higher order bits and the lower order bits by the differential bit number between the valid bit number and the remaining bit number in response to the second shift amount from said shift amount determination circuit, to thereby supply the higher order bits and the lower order bits respectively to said second register and said third register, and said selector being operable to selectively output, for loading in bit-parallel fashion to said second register, the higher order bits obtained by the barrel shifting.

17. A compressed data expanding circuit according to claim 16, wherein said shift amount determination circuit outputs a comparison signal corresponding to a first shift amount when the valid bit number and the remaining bit number are equal to each other, said barrel shifter being operable to load the respective data of said second register and said third register as higher order data and lower order data to barrel-shift both of the higher order bits and lower order bits by the remaining bit number in response to the first shift amount from said shift amount determination circuit, to thereby supply the lower order bits to said third register, and said selector being operable in response to the comparison signal to selectively output the compressed data in said first register to said second register in response to the result of comparison by said shift amount determination circuit so as to load to said second register in bit-parallel fashion.

18. A compressed data expanding circuit according to claim 16, wherein said shift amount determination circuit outputs a comparison signal corresponding to a third shift amount for shifting by the valid bit number when said remaining bit number is larger than said valid bit number, said barrel shifter being operable to load the respective data of said second register and said third register as higher order data and lower order data to barrel-shift both of the higher order data and the lower order data by the remaining bit number in response to the third shift amount from said shift amount determination circuit, to thereby supply the higher order data and the lower order data respectively to said second register and said third register, and said selector being operable in response to the comparison signal to selectively output the higher order data obtained by the barrel shifting to load to said second register in bit-parallel fashion.

* * * * *